(12) United States Patent
Ladebeck et al.

(10) Patent No.: US 10,429,465 B2
(45) Date of Patent: Oct. 1, 2019

(54) METHOD AND MAGNETIC RESONANCE APPARATUS FOR DETERMINING A SHIM SETTING

(71) Applicant: Siemens Healthcare GmbH, Erlangen (DE)

(72) Inventors: Ralf Ladebeck, Erlangen (DE); Daniel Niederloehner, Erlangen (DE); Johann Sukkau, Herzogenaurach (DE)

(73) Assignee: Siemens Healthcare GmbH, Erlangen (DE)

( * ) Notice: Subject to any disclaimer, the term of this patent is extended or adjusted under 35 U.S.C. 154(b) by 239 days.

(21) Appl. No.: 15/485,599

(22) Filed: Apr. 12, 2017

(65) Prior Publication Data

US 2017/0293004 A1      Oct. 12, 2017

(30) Foreign Application Priority Data

Apr. 12, 2016   (DE) .......................... 10 2016 206 069

(51) Int. Cl.
| | | |
|---|---|---|
| *G01V 3/00* | (2006.01) | |
| *G01R 33/3875* | (2006.01) | |
| *G01R 33/44* | (2006.01) | |
| *G01R 33/56* | (2006.01) | |

(52) U.S. Cl.
CPC ....... *G01R 33/3875* (2013.01); *G01R 33/443* (2013.01); *G01R 33/5608* (2013.01)

(58) Field of Classification Search
CPC .................................................. G01R 33/3875
USPC .................................................. 324/319, 320
See application file for complete search history.

(56) References Cited

U.S. PATENT DOCUMENTS

| | | | | |
|---|---|---|---|---|
| 4,899,109 A | * | 2/1990 | Tropp ................ | G01R 33/3875 324/319 |
| 5,006,804 A | * | 4/1991 | Dorri ................ | G01R 33/3875 324/320 |
| 6,714,109 B1 | * | 3/2004 | Rimkunas .......... | G01R 33/3873 324/320 |
| 6,836,119 B2 | * | 12/2004 | DeMeester ........ | G01R 33/3873 324/309 |
| 2015/0054510 A1 | | 2/2015 | Biber et al. | |

* cited by examiner

*Primary Examiner* — Louis M Arana
(74) *Attorney, Agent, or Firm* — Schiff Hardin LLP

(57) ABSTRACT

In a method and magnetic resonance apparatus for determining a shim setting in order to increase a homogeneity of the basic magnetic field of the scanner of the apparatus by operating a shim element, information is obtained concerning the dependence of an induced field of the shim element on a set shim setting. A first field map is recorded and a first shim setting for the shim element is determined based on the first field map. A second field map is recorded while the shim element is driven with the first shim setting. A field induced by the shim element by the first shim setting is determined based on the first field map and the second field map. A second shim setting for the shim element is determined based on the determined induced field and the acquired information.

12 Claims, 3 Drawing Sheets

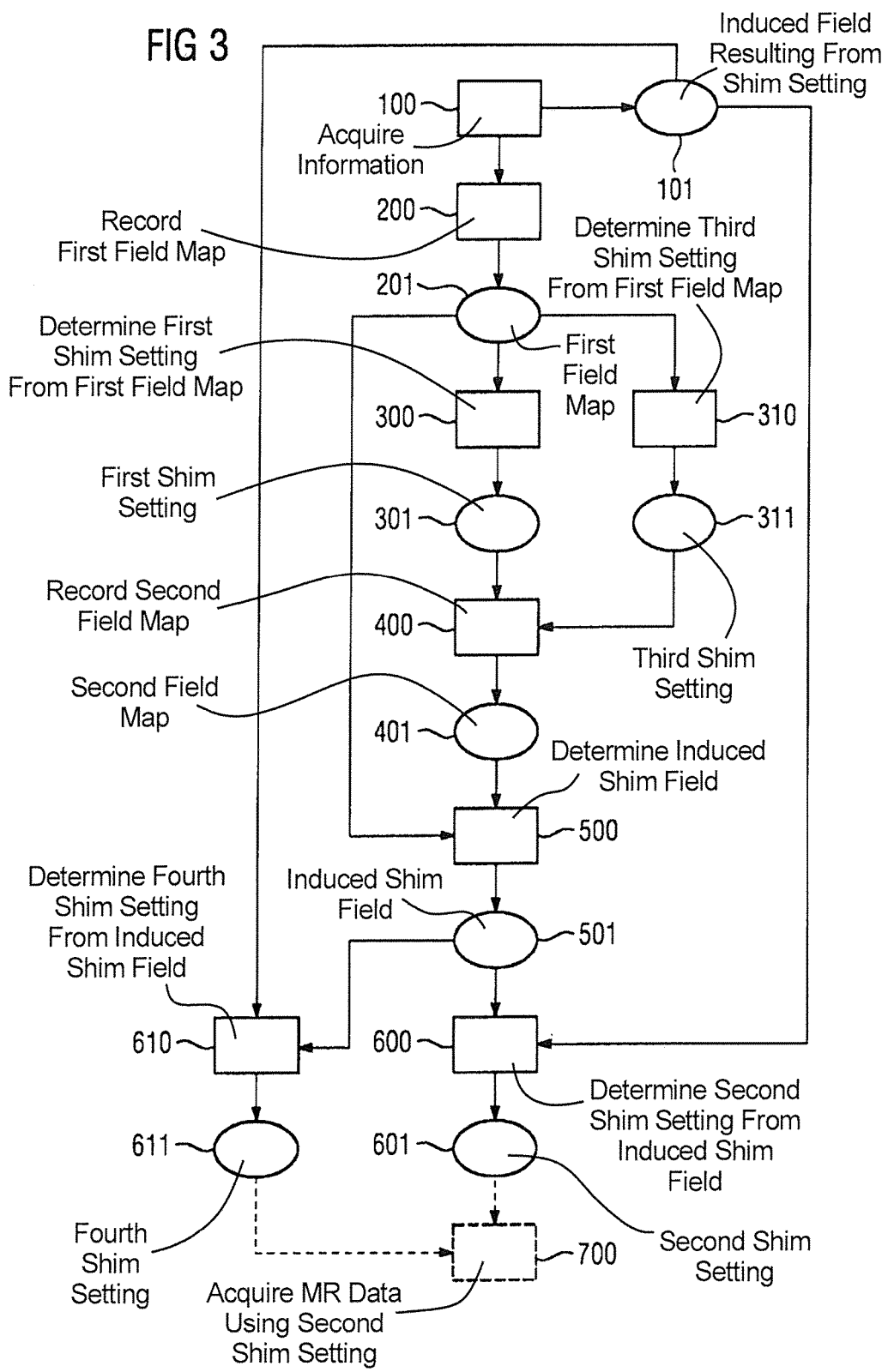

METHOD AND MAGNETIC RESONANCE APPARATUS FOR DETERMINING A SHIM SETTING

BACKGROUND OF THE INVENTION

Field of the Invention

The present invention concerns a method, a magnetic resonance (MR) apparatus, and a non-transitory computer-readable data storage medium for determining a shim setting in order to increase the homogeneity of a basic magnetic field of a magnetic resonance apparatus, by operation of a shim system.

Description of the Prior Art

In the MR data acquisition scanner of a magnetic resonance apparatus, the body of an examination subject, in particular a patient that is to be examined is typically exposed to a relatively high basic magnetic field, 1.5 or 3 or 7 tesla for example, with the use of a basic magnet. In addition, gradient pulses are applied with the use of a gradient coil arrangement. Radio-frequency pulses, for example excitation pulses, are then transmitted via a radio-frequency antenna arrangement by suitable antennas, resulting in the nuclear spins of specific atoms of the subject which are excited into resonance by the radio-frequency pulses, being tipped through a defined flip angle with respect to the field lines of the basic magnetic field. During the relaxation of these nuclear spins, radio-frequency signals, also known as magnetic resonance signals, are emitted, and are received by suitable radio-frequency antennas and then processed further. The desired image data can be reconstructed from the raw data acquired in this way.

Accordingly, it is necessary to transmit a specific magnetic resonance sequence, also known as a pulse sequence, for a specific measurement. This magnetic resonance sequence is composed of a train of radio-frequency pulses, excitation pulses and refocusing pulses for example, as well as, appropriately times, gradient pulses that are transmitted in a coordinated manner in different gradient axes along different spatial directions. Readout windows, matched with respect to time to the pulses, are set that specify the time periods in which the induced magnetic resonance signals are captured.

In magnetic resonance imaging with such a magnetic resonance apparatus, the homogeneity of the basic magnetic field in the examination volume is a factor of major importance. Even small deviations in homogeneity can lead to large deviations in a frequency distribution of the nuclear spins, with the result that qualitatively inferior magnetic resonance image data are acquired.

Shim systems are known for the purpose of improving the homogeneity in the examination volume. Although shim plates of ferromagnetic material can be strategically placed at locations so as to influence this homogeneity, the shim systems of concern herein are conductive shim elements provided with currents by a shim supply such as a processor-controlled amplifier. When a magnetic resonance apparatus is installed at its intended deployment site, fields present in the environment can limit the homogeneity of the basic magnetic field, in particular around an isocenter of the magnetic resonance scanner. For that reason, when a magnetic resonance apparatus is installed and commissioned, often in conjunction with calibration measurements, the shim element is adjusted so as to establish a maximally optimal homogeneity. Accordingly, basic shim settings are calculated at the time of installation and commissioning of the magnetic resonance apparatus.

However, the examination subject that is to be scanned itself constitutes a further source of inhomogeneity. For example, when a person who is to be examined is introduced into the magnetic resonance scanner, the material of the body causes further disruption to the homogeneity. In order to counteract this problem, it is known to use an adjustable shim system. In particular, shim systems are known for this purpose that, when the shim elements thereof are driven by means of different shim currents, generate different compensation magnetic fields in order to improve the homogeneity.

The shim elements of the adjustable shim system can be integrated into the magnetic resonance scanner and be enclosed by the housing thereof or may be integrated into a local coil assembly that is used to transmit and/or receive the aforementioned radio-frequency signals. Local coils can be positioned on the surface of a patient's body or at a short distance therefrom, for example at up to 5 cm. Typical local coils are reception coils for detecting the magnetic resonance signals. There are also local coils that are designed to transmit radio-frequency pulses. Coils of this type are also referred to as local transmit coils or as local transmit/reception coils, and may include an adjustable shim element. Typically, an adjustable shim element integrated into a local coil is used in addition to another adjustable shim element enclosed by the housing of the magnetic resonance scanner.

In order to shim the disruptions of the subject that is to be examined, it is conventional practice, when initially driving the shim coil or coils according to basic shim settings obtained during the installation and commissioning of the magnetic resonance scanner, to use the magnetic resonance apparatus itself to perform a measurement of the field distribution when the person to be examined has been introduced into a patient receiving zone of the magnetic resonance scanner. Thereafter, using the basic shim settings as a starting point, optimized shim settings are determined by a computer while taking into account the measured field distribution. Using the optimized shim settings, the shim element or elements is/are then driven in order to achieve a maximally optimal homogeneity. Typically, basic shim settings of the type exist for shim systems having shim elements that are not integrated into local coils.

Shim systems with coils that are integrated in local coils in most cases generate local and/or spatially strongly varying compensation fields, which are subject to a strong spatial modulation. Minor spatial changes to such shim elements, for example displacements by a few millimeters, and/or small deviations between an applied and a realized shim setting, in some cases cause such differences between a desired and a generated compensation field that the homogeneity of the basic magnetic field may be increased to a lesser degree than expected or, as the case may be, even be made worse. Consequently, a precise determination of the shim setting, particularly in the case of shim coils that are integrated in local coils, is essential.

SUMMARY OF THE INVENTION

An object of the invention is to provide a method that enables a particularly precise determination of a shim setting in order to increase the homogeneity of the basic magnetic field of a magnetic resonance scanner by operation of a shim system. It is furthermore an object of the invention to provide a magnetic resonance apparatus and a non-transitory, computer-readable data medium that are designed to perform the inventive method.

The inventive method for determining a shim setting in order to increase the homogeneity of the basic magnetic field of a magnetic resonance scanner by operation of a shim system includes the following steps.

Information are acquired that describe the dependence of an induced field of the shim element on a shim setting that has been set.

A first field map is recorded and provided to a processor.

A first shim setting for the shim element is determined in the processor based on the first field map.

A second field map is recorded while the shim element is driven in accordance with the first shim setting.

A field induced by the shim element as a result of the first shim setting based on the first field map and the second field map.

A second shim setting for the shim element is determined by the processor based on the determined induced field and the acquired information. The second shim setting is provided as an electronic output from the processor in order to operate the shim element therewith.

A shim element typically has one or more electrical leads (conductors) and/or shim coils. Preferably, each lead and/or shim coil is driven by an individual shim current provided thereto. The shim current generates a magnetic field that is superimposed on the basic magnetic field, which has possibly been modulated by the material of the examination subject. Preferably, compensation fields are generated in the shim element by shim currents. The compensation fields preferably increase the homogeneity of the basic magnetic field.

A shim setting may be a setting for driving a shim element, in particular of at least one electrical shim coil, of the magnetic resonance scanner. A shim setting may be an assignment of at least one electric current, in particular a shim current, for at least one of the leads contained in the shim element and/or at least one shim coil. A shim setting may be a parameter or a parameter set that is a measure for the driving of at least one shim element. The shim settings may specify a (possibly time-dependent) current distribution of at least one shim current in at least one shim element.

A shim element is driven on the basis of the shim setting. For this purpose, a shim controller can apply the current/currents specified by the shim setting to the shim element, for example. This typically induces a field. The induced field is typically dependent on the set shim setting, i.e. the shim setting with which the shim element is driven, and on the shim element itself.

The acquisition of the information can be that the information is provided to the computer, for example in the sense that it is loaded into the computer. The acquisition of the information can be that the information is loaded from a database. The information may be stored in a memory which of the magnetic resonance apparatus, or assigned to an external data storage medium. The information can be acquired by a determination of the dependence of the induced field, for example by the computer of the magnetic resonance apparatus, based on data that are provided to the computer, for example by a memory or an external storage medium such as a data medium.

The dependence of the induced field can be determined analytically, numerically or experimentally. An analytical or numerical determination of the dependence is typically carried out for each shim element that is to be produced or manufactured. A field induced by a manufactured shim element may be checked experimentally. At the start of the method according to the invention, information representing the dependence between an induced field of the shim element and a set shim setting is acquired. The dependence may be expressed in the form of a function and/or a value table.

A field map typically indicates the spatial field distribution, i.e. the strength or a measure for the strength of the static basic magnetic field as a function of location. The field map is accordingly a spatially-dependent function of the basic magnetic field. Typically, in order to record a field map, a suitable magnetic resonance sequence is transmitted and the corresponding data are recorded and processed so that the spatial field distribution can be determined. If an examination subject is present in the patient receiving zone of the magnetic resonance scanner, the basic magnetic field is altered due to a modulation induced by the examination subject. To avoid such modulations when carrying out an examination of the examination subject, it is necessary to record a field map in order to obtain knowledge of the real field distribution, in which case, while the field map is being recorded, the examination subject is located in the patient receiving zone of the magnetic resonance apparatus, preferably at the position at which image data is to be recorded. A field map may be recorded for a slice or for a volume. Preferably, the field map is recorded in the region of the examination volume.

If a basic shim setting is available for the shim element, the shim element is typically driven on the basis of the basic shim setting when the first field map is recorded. If no basic shim setting exists, the first field map is typically recorded without the shim element inducing a field.

A first shim setting for the shim element is determined based on the first field map. The field map is preferably present in the form of a data set that can be provided to a determination processor of the magnetic resonance apparatus via an input of the determination processor. Preferably, a first algorithm executed in the determination processor. The first algorithm uses the data set as input parameters and calculates and/or determines the first shim setting. The first algorithm is designed to cause the first shim setting to be determined so that, when the shim element is driven on the basis of the first shim setting, the homogeneity of the basic magnetic field in the presence of the examination subject is improved, that is to say increased. The information concerning the dependence of an induced field of the shim element on a set shim setting is preferably provided to the determination processor for this purpose so that the first algorithm can access the information and/or can use the information as input parameters. Given knowledge of the dependence, the expected field induced by a first shim setting and the shim element can be anticipated. This may be different from the induced field that is generated when the shim element is driven by the first shim setting. This information concerning the dependence permits an improved determination of the first shim setting in certain conditions. The first shim setting can be provided for the further implementation of the method as an output parameter via an output of the determination processor. The first shim setting can be provided to the shim supply, which drives the shim element in accordance with the first shim setting.

A second field map is recorded analogously to the recording of the first field map, the recordings differing from one another in that, when the second field map is recorded, the shim element is driven in accordance with the first shim setting. Preferably, the only difference between the two recordings is the manner in which the shim element is driven. The positions of the examination subject and the shim element are the same for both recordings.

The determination processor is configured to determine, based on the first field map and the second field map, the field induced by the shim element with the first shim setting. In this case the first field map and the second field map are provided to a second algorithm that is executed by the determination processor. The first field map and/or the second field map can be provided to the determination processor via its input and/or the first field map can be known to the determination processor from the determination of the first shim setting by it being stored in a memory of the determination processor. The second algorithm is designed such that the field induced by the shim element is determined from a difference between the first field map and the second field map. The induced field determined in this way thus represents the change caused by driving the shim element in accordance with the first shim setting. Typically, the induced field determined in this way is present in the form of a field distribution. The thus determined induced field may differ from the field that would be expected based on the knowledge of the information concerning the dependence by the first shim setting and the shim element. The following options can be identified as possible causes, for example:

manufacturing tolerances during the manufacture of the shim element, inaccurate positioning of the shim element or of a local coil in which the shim element is integrated, deformation of the shim element or of a local coil with the shim element due to the weight of the examination subject.

In the concluding method step of the method according to the invention, a determination of the second shim setting for the shim element, with the determined induced field and the acquired information being taken into account. Preferably, the first shim setting is also taken into account. The second shim setting is preferably determined by the determination processor by execution of a third algorithm. Based on the knowledge of the determined induced field and the first shim setting it is possible to determine the real effect of the shim element. A goal of the second shim setting can be to compensate for a deviation of the real effect from the expected effect of the shim element based on the acquired information, by driving the shim element in accordance with the second shim setting, as well as to increase the real homogeneity of the basic magnetic field.

In addition to the dependence of an induced field of the shim element on a set shim setting, the acquired information may include further data. For example, the further data may represent a dependence of a spatial position of the shim element on the weight of the examination subject. It is likewise conceivable for the second shim setting, and/or further settings and/or values determined during the performance of the method, to be transferred to an analysis processor that evaluates the data statistically and/or accumulates the data, and where appropriate provides the data to future executions of the method. It is also conceivable for the analysis processor to determine an improved first shim setting based on the accumulated data and patient-specific data by execution of a fourth, self-learning algorithm, such that the determination of the second shim setting is superfluous.

An iterative execution of the method is conceivable in order to achieve an improved determination of a shim setting. Thus, the determination of the second shim setting may be followed by a recording of a third field map, in which case, while the third field map is being recorded, the shim element is driven in accordance with the second shim setting. The field induced by the shim element driven by the second shim setting can be determined based on previous findings and the third field map. A third shim setting for the shim element can be determined based on the determined induced field and the acquired information. These method steps can be repeated iteratively.

An advantage of the method according to the invention is the ability to determine an accurate shim setting for the shim element. Conventionally, the expected field generated by a shim element is known from numerical calculations. In the case of serially produced shim elements, these calculations typically apply, as is industry practice, to all shim elements of the series. The expected field generated by a specific shim element is typically not calibrated individually for that shim element, because this is time-consuming and cost-intensive. Conventionally, the determination of the shim setting is based on a calculation of this type, in rare cases also on such an individual calibration of a shim element, with a specific position of the shim element being assumed. The position is typically known only approximately from the design of the magnetic resonance scanner, and/or the positioning of the shim element, by a patient support device, for example. Conventionally, a shim setting is determined based on this information, but the following items cannot be taken into account:

the exact position of the shim element (relative to the examination subject), the implementation of a shim setting by the shim element, influences of the patient on the shim element, such as the patient's weight, and manufacturing tolerances in the absence of individual calibration The method according to the invention enables the field actually generated by the shim element to be verified and takes this knowledge into account in the determination of the final, typically the second, shim setting. This enables factors that influence the field actually generated by the shim element to be taken into account individually in each examination. These factors may be specific to the shim element used and/or specific to the individual examination situation. Thus, the knowledge of the exact position of the shim element at the commencement of the method is not necessary, because the method compensates for differences resulting therefrom. Similarly, the implementation of a shim setting by the shim element is verified and influences of the patient on the shim element, such as the patient's weight, are taken into account. Manufacturing tolerances can be compensated for. The method according to the invention is therefore robust with regard to a number of external influences that can affect the action of a shim element. Accordingly, the method typically describes an adaptation of the shim element to the individual examination, such that the spatial position of the field generated by the shim element is preferably optimally matched to the examination subject and the subject's position in the scanner. Typically, the advantage is particularly marked in the case of shim elements that generate very localized fields, which fields are subject to a strong spatial modulation.

In an embodiment of the method, image data of the examination subject are acquired in a further method step while the shim element is driven in accordance with the second shim setting. The further method step is typically performed after the method step of determining a second shim setting. Typically, magnetic resonance apparatuses are used for acquiring image data of an examination subject. When used for driving the shim element in the presence of an examination subject, the shim setting determined in accordance with the inventive method can homogenize the basic magnetic field in the examination region to particularly good effect. A homogeneous basic magnetic field typically contributes toward a high quality of the image data generated by the magnetic resonance imaging. Driving the shim element in accordance with the second shim setting during the acquisition of the image data of the examination subject can accordingly ensure that the basic magnetic field is homogeneous at the time of the acquisition, and the shim setting determined by the method according to the invention increases the homogeneity. An advantage of this embodiment of the method is that the quality of the image data acquired in this way is particularly good.

In another embodiment of the method, the determination the second shim setting is done by calculating an induced field for the first shim setting of the shim element based on the acquired information, and comparing the calculated induced field with the determined induced field.

The acquired information represents the dependence of an induced field of the shim element on a set shim setting. Consequently, the field induced when the shim element is driven in accordance with the first shim setting can be calculated on the basis of the first shim setting and with knowledge of the dependence. A calculation of this type may also be referred to as a simulation. The field calculated in that way may be referred to as the field to be expected based on the acquired information. Since the calculated field is based on the acquired information, the calculated field reflects the underlying characteristics of the shim element in the acquired information. If, for example, the acquired information is based on numerical calculations, then the calculated field specifies the theoretical field based on the numerical calculations. If the acquired information is based on measurements for the individual shim element used, then manufacturing tolerances of the coil used are taken into account, for example. As the exact position of the shim element is typically not known, because, the examination subject causes a deformation and/or, in the case of a shim element integrated into a local coil, the position of the local coil can be specified only within the degree of the accuracy of the knowledge of the position of the patient support device, the calculated induced field typically deviates from the determined induced field.

Typically, in the comparison of the calculated induced field with the determined induced field, similarities and/or differences between the fields are identified. For example, a deviation can be determined on the basis of a difference between the calculated induced field and the determined induced field. The second shim setting is preferably determined so as to compensate for the deviation between the calculated induced field and the determined induced field. This means in particular that the deviation of the field that would be generated if the shim element were driven in accordance with the second shim setting from the field that is to be expected according to the acquired information, and the second shim setting is preferably quantifiable by the determination processor and is taken into account in the choice of the second shim setting. The field generated when the shim element is driven in accordance with the second shim setting preferably corresponds to the field that is to be expected according to the acquired information and the first shim setting.

An advantage of this embodiment of the method is that the information used as a basis for determining the second shim setting is used for as exact a calculation or simulation as possible of the expected field, as a result of which the second shim setting can be determined particularly accurately.

In another embodiment of the method, the calculated induced field is compared with the determined induced field by the use of regression analysis, taking into account at least one variable for a spatial displacement and/or for a scalar amplitude modulation. The goal pursued by the comparison is preferably to determine as precisely as possible the deviation between the calculated induced field and the determined induced field. The comparison preferably pursues the goal of deriving a first function from the deviation, which first function specifies a quantitative relation between the determined induced field and the calculated induced field. The first function preferably describes a mapping that is embodied to generate a congruence between the calculated induced field and the determined induced field. The determination of the first function is preferably based on a regression analysis. As the variable used, preferably at least one spatial direction of three spatial directions spanning the space is chosen for a translation and/or a scalar for a modulation of the amplitude, i.e. the strength, of the field generated when the shim element is driven in accordance with a shim setting. An advantage of this embodiment of the method is that the difference between the two fields can be quantified particularly accurately in the comparison. The further determination of the second shim setting can be carried out based on the quantitative results.

In another embodiment of the method, the shim element is a local shim element that can be positioned at different positions relative to the magnetic resonance scanner. A local shim element is typically not enclosed by the housing of the magnetic resonance scanner. A local shim element is positionable at any desired position in the patient receiving zone, preferably close to the surface of the body of the patient, i.e. of the examination subject. The local shim element is preferably introduced together with the examination subject into the patient receiving zone and is mounted in a fixed position relative to the patient. The local shim element can be introduced together with the examination subject into the patient receiving zone by the patient support device. Accordingly, the local shim element is typically positioned closer to the surface of the examination subject's body than a shim element that is enclosed by the housing of the magnetic resonance scanner and consequently such a housing-enclosed shim element is typically positioned outside of the patient receiving zone. A local shim element is preferably designed such that the fields induced when it is being driven have a small range of, for example, up to 10 cm, and typically are subject to strong local variations. A shim element of this type can accordingly be suitable for compensating for local and/or spatially strongly varying deviations in the homogeneity of the basic magnetic field that are induced, for example, by an examination subject. For this purpose, a positioning on the body surface is essential. Typically, the precise position of a local shim element cannot be determined exactly at the time of positioning the patient. If, when such a local shim element is used, a procedure in accordance with the inventive method is followed, it is possible to compensate particularly accurately for deviations in the induced field due to manufacturing tolerances and/or an inaccurate positioning. The efficient use of a local shim element which is embodied to compensate for local, i.e. spatially strongly varying, changes in the basic magnetic field is made possible only by the method according to the invention.

In another embodiment of the method, the local shim element is integrated into a local transmit coil. Local transmit coils typically have an input for a transmit channel and typically are also designed to receive signals. Typically, the purpose of using a local transmit coil is to generate a particularly homogeneous RF field of excitation pulses, in a delimited examination region of the examination subject. In this case the examination region is preferably limited by the volume of the local coil. In the examination region, the homogeneity of the basic magnetic field is typically essential in addition to the homogeneity of the RF field that is generated by the excitation pulses. When a local transmit coil is used, the demands imposed on the quality of the image data of the examination region are typically exceptionally high, for which reason a local shim element is preferably integrated into the local transmit coil. Analogously to the local shim element, under described circumstances, the compensation for deviations of the induced field due to the position of the shim element not being known exactly is typically particularly relevant. For this reason, the efficient use of a local transmit coil is made possible only by the method according to the invention.

In another embodiment of the method, a third shim setting is determined for a further shim element based on the first field map.

The further shim element is preferably arranged such that the further shim element is enclosed by the housing of the magnetic resonance scanner. The further shim setting is preferably determined for a fixed position relative to the magnetic resonance scanner. Preferably, a basic shim setting exists for the further shim element. The further shim element is preferably driven in accordance with the basic shim setting when the first field map is recorded. Further information is preferably provided to the method or the further information is acquired in a method step, the further information representing the dependence of an induced field of the further shim element on a set shim setting. It is preferably assumed in the course of the method that the field calculated for the further shim element based on the further information and a further shim setting, for example the third shim setting, corresponds to the field induced when the further shim element is driven in accordance with the further shim setting. In addition to the determination of the first shim setting for the shim element, the third shim setting for the further shim element is preferably determined based on the first field map. The first shim setting and the third shim setting are preferably determined jointly, and such that, in accordance with the acquired information and the further information with simultaneous driving of the shim element in accordance with the first shim setting and the further shim element in accordance with the third shim setting, the homogeneity of the basic magnetic field in the examination region is as high as possible.

The second field map is preferably recorded while the shim element is driven in accordance with the first shim setting and the further shim element is driven in accordance with the third shim setting. During determination of the field induced by the shim element by means of the first shim setting based on the first field map and the second field map, the field generated in the second field map by the further shim element in accordance with the third shim setting and/or if necessary the field generated in the first field map by the further shim element in accordance with the basic shim setting are preferably taken into account.

An advantage of this embodiment of the method is that two shim elements can be used simultaneously in order to increase the homogeneity of the basic magnetic field. This is particularly advantageous when the basic magnetic field exhibits strong deviations in homogeneity that are not possible to be compensated by the shim element. Typically, the strong deviations in the homogeneity of the basic magnetic field are already compensated during the recording of the second field map, by the preferred driving of the further shim element in accordance with the third shim setting. Consequently, an improved compensation for locally limited deviations in the homogeneity of the basic magnetic field in the examination region can be realized during determination of the second shim setting.

In another embodiment of the method, a fourth shim setting for a further shim element is determined based on the determined induced field and the acquired information.

According to this embodiment, a second shim setting for the shim element and a fourth shim setting for the further shim element can be determined based on the first and the second field maps and the acquired information, and if necessary the further information. The second and the fourth shim settings are preferably determined simultaneously. The second and the fourth shim settings are preferably determined such that the homogeneity of the basic magnetic field in the presence of the examination subject is as high as possible when the shim element is driven in accordance with the second shim setting and the further shim element is driven in accordance with the fourth shim setting. When the further method step for acquiring image data of an examination subject is carried out, the shim element is preferably driven in accordance with the second shim setting, and the further shim element in accordance with the fourth shim setting. An optimization of this kind, in which the shim elements are driven based on at least two variable shim settings, i.e. the second and the fourth shim setting, can improve the resulting homogeneity.

In another embodiment of the method, a position of a shim element relative to the further shim element is taken into account during determination of the first and/or second and/or third and/or fourth shim setting. Preferably, the position of the shim element relative to the examination subject and/or to a fixed point of the magnetic resonance apparatus are also taken into account. A determination of a shim setting carried out in this way increases the accuracy of the shim setting.

The magnetic resonance apparatus according to the invention has a scanner in which a shim element is situated, and a computer that has a determination processor configured to perform the method according to the invention described above in order to determine a shim setting that increases homogeneity of a basic magnetic field of the scanner. The magnetic resonance apparatus according to the invention is designed to perform the method according to the invention by operation of the determination processor. For that purpose, the determination processor has an input via which information concerning the dependence of an induced field of the shim element on the set shim setting and/or the field maps and/or data required for determining field maps, can be provided to the determination processor. Further functions, algorithms or parameters required in the method can be provided to the determination processor via the input. The processor is configured to determine a shim setting and/or a field induced by the shim element in accordance with a shim setting. The determined shim settings are provided via the output. The determination processor may be integrated into the magnetic resonance apparatus. The determination processor may also be installed separately from the magnetic resonance apparatus. The determination processor can be connected to the magnetic resonance apparatus.

Embodiments of the magnetic resonance apparatus according to the invention are analogous to the embodiment of the method according to the invention. The magnetic resonance apparatus may include further control components that are necessary and/or advantageous to the performance of the method according to the invention. The magnetic resonance apparatus may also be designed to send control signals and/or to receive and/or process control signals in order to perform the method according to the invention. The determination processor is preferably part of the computer of the magnetic resonance apparatus according to the invention. A memory unit of the computer may be used to store computer programs and further software used by the determination processor to automatically control and/or perform execution of the method according to the invention.

The non-transitory, computer-readable data storage medium according to the invention can be loaded directly into a memory of the programmable computer of a magnetic resonance apparatus, and has program code that causes the method according to the invention to be implemented when the program code is executed in the computer of the magnetic resonance apparatus. This enables the method according to the invention to be performed quickly, robustly and in an identically reproducible manner. The computer must provide certain prerequisites, such as a suitable random access memory, a suitable graphics card or a suitable logic unit, for example, so that the respective method steps can be performed efficiently.

Examples of electronically readable data media are a DVD, a magnetic tape or a USB stick on which electronically readable control information, in particular software, is stored.

The advantages of the magnetic resonance apparatus according to the invention and the computer-readable data medium according to the invention substantially correspond to the advantages of the method according to the invention for determining a shim setting, which are explained in detail above. Features, advantages or alternative embodiment variants mentioned in this regard may equally be applied to the other aspects of the invention.

BRIEF DESCRIPTION OF THE DRAWINGS

FIG. 3 is a flowchart of a second embodiment of a method according to the invention.

DESCRIPTION OF THE PREFERRED EMBODIMENTS

Figure 1:
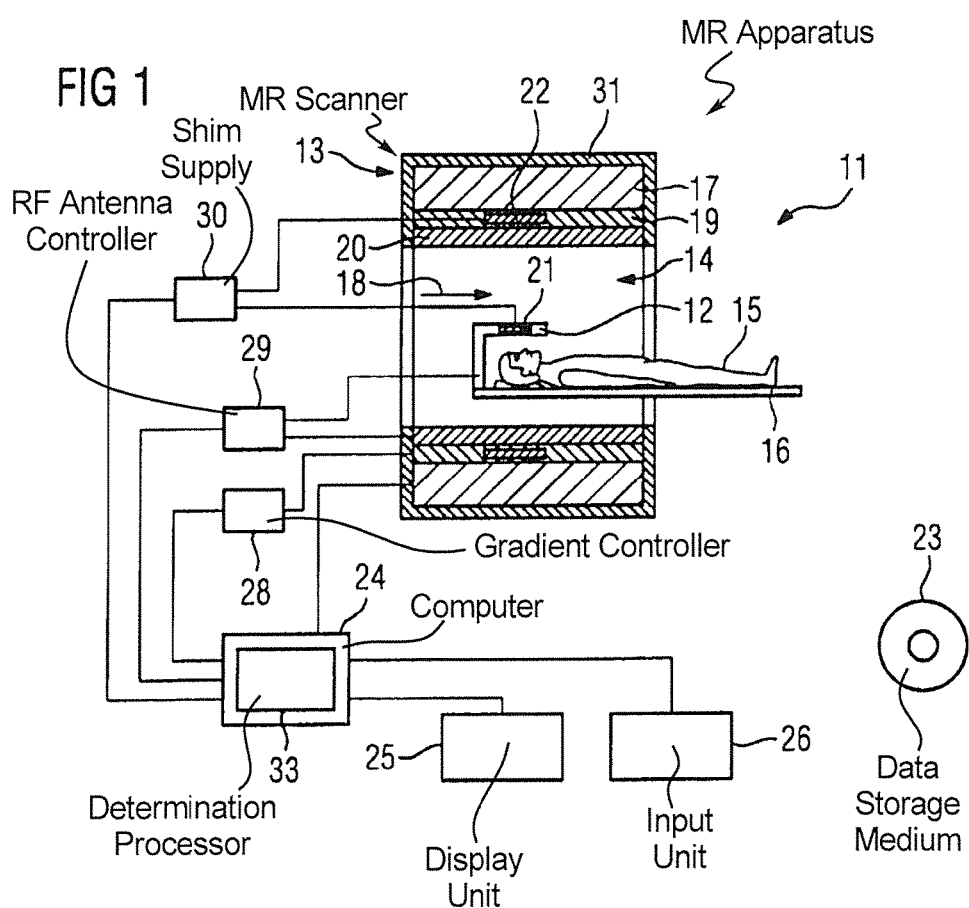
FIG. 1 shows a magnetic resonance apparatus according to the invention in a block diagram.

FIG. 1 shows, in a bloc diagram, an inventive magnetic resonance apparatus 11 for performing an inventive method. The magnetic resonance apparatus 11 has a data acquisition scanner 13 that has a basic field magnet 17 that generates a strong and constant basic magnetic field 18. The magnetic resonance scanner 13 has a cylinder-shaped patient receiving zone 14 for receiving a patient 15, the patient receiving zone 14 being cylindrically enclosed by the scanner 13 in a circumferential direction. The patient 15 can be introduced into the patient receiving zone 14 by a patient support 16 of the magnetic resonance apparatus 11. To that end, the patient support 16 has a patient table that is movable inside the scanner 13. The scanner 13 is shielded externally by a housing enclosure 31. The scanner 13 additionally has a gradient coil arrangement 19, which is used for spatial encoding of MR signals during an imaging session. The gradient coil arrangement 19 is driven by a gradient controller 28.

The magnetic resonance apparatus 11 has a local transmit coil 12, which surrounds the head of the patient 15. A radio-frequency antenna controller 29 is designed to operate the local transmit coil 12 so as to radiate radio-frequency pulses. A signal reception unit may also be integrated into the local transmit coil 12. The scanner 13 additionally has a radio-frequency antenna unit 20 which, in the case shown, is embodied as a bodycoil permanently integrated into the magnetic resonance apparatus 11. Alternatively to the local transmit coil 12, the radio-frequency antenna controller 29 can drive the radio-frequency antenna unit 20 in order to radiate radio-frequency pulses into an examination volume that is substantially formed by the patient receiving zone 14.

The radiated radio-frequency pulses excite certain nuclear spins in the patient 15, thereby giving those excited nuclear spins a magnetization that deviates, by a so-called flip angle, from the magnetic field lines of the basic magnetic field 18. As those excited nuclear spins relax and return to the steady state, they emit radio-frequency signals, called magnetic resonance (MR) signals. Those MR signals are detected by the same radio-frequency coil that radiated the excitation pulses, or possibly by a different radio-frequency coil.

The local transmit coil 12 has a shim element 21 in the form of a local shim element, which can be positioned by the patient support device 16 at different positions relative to the scanner, in particular relative to the isocenter of the patient receiving zone 14. In this arrangement, the local shim element is integrated into the local transmit coil 12. The magnetic resonance scanner 13 has a further shim element 22. The further shim element 22 is preferably arranged in a fixed position relative to the magnetic resonance apparatus 11, in particular relative to the isocenter of the patient receiving zone 14. The shim element 21 and the further shim element 22 can be driven by the shim supply 30 in accordance with set shim settings.

In order to control the basic field magnet 17, the gradient controller 28 and the radio-frequency antenna controller 29, the magnetic resonance apparatus 11 has a computer 24. The computer 24 is responsible for the centralized control of the magnetic resonance apparatus 11, such as performing MR control sequences. Control information such as imaging parameters, as well as reconstructed image data, can be displayed for a user on a display unit 25, for example on at least one monitor, of the magnetic resonance apparatus 11. In addition, the magnetic resonance apparatus 11 has an input unit 26 via which information and/or imaging parameters can be emptied by a user during a measurement process. The computer 24 may include the gradient controller 28 and/or the radio-frequency antenna controller 29 and/or the display unit 25 and/or the input unit 26. The computer 24 additionally has a determination processor 33. In combination with the determination processor 33, the magnetic resonance apparatus 11 is therefore configured to perform a method according to the invention.

The illustrated magnetic resonance apparatus 11 may of course have further components that are normally included in magnetic resonance apparatuses 11. The general principles of operation of a magnetic resonance apparatus are known to those skilled in the art, so a more detailed description of such operation is not necessary herein.

The method described herein may be present in the form of program code that causes the method to be implemented when the code is executed by the computer 24. The program code is stored in a computer-readable data storage medium 23.

Figure 2:
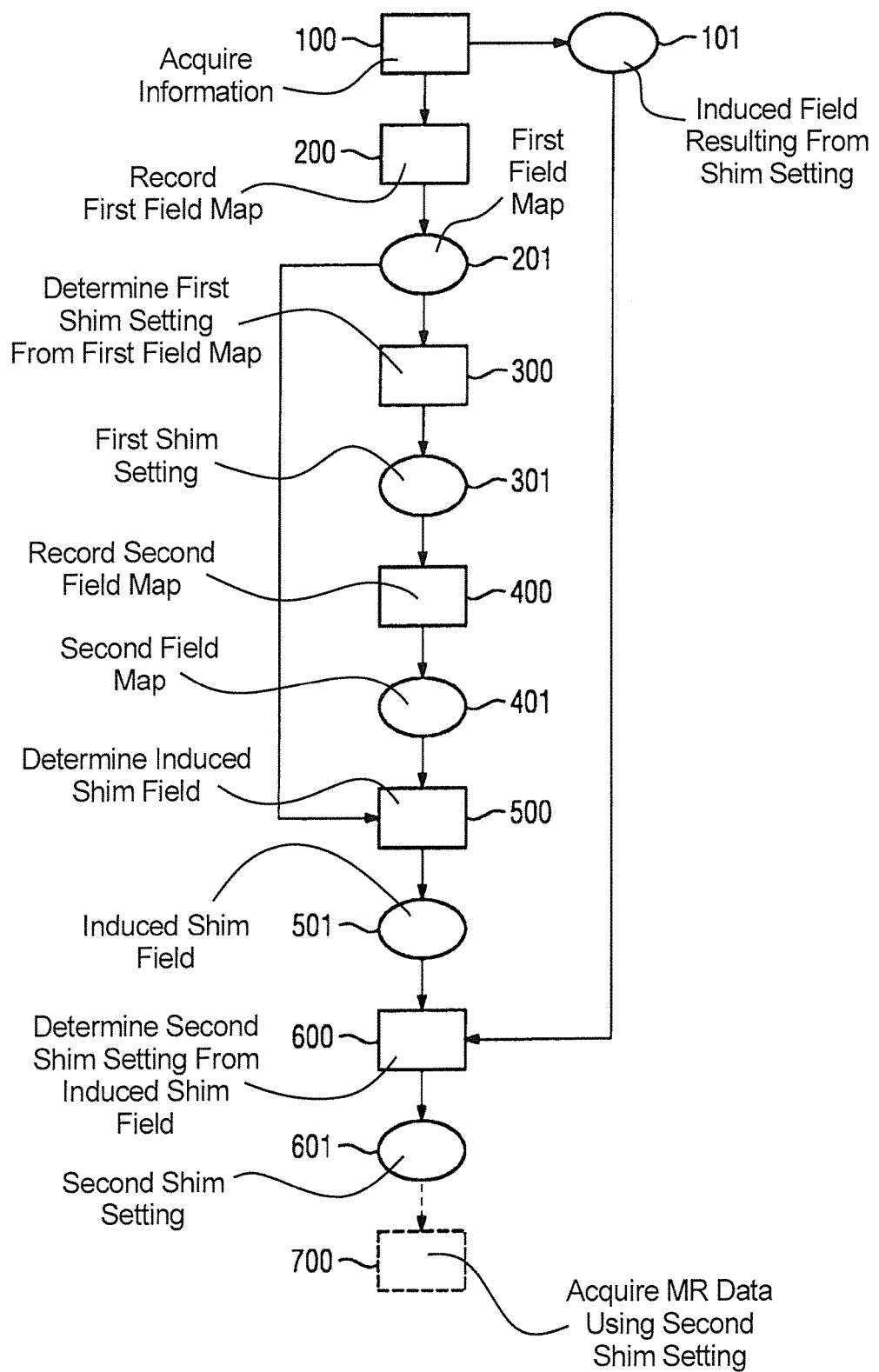
FIG. 2 is a flowchart of a first embodiment of the method according to the invention.

FIG. 2 shows a flowchart of a first embodiment of the method according to the invention. The method for determining a shim setting in order to increase the homogeneity of the basic magnetic field 18 of the magnetic resonance apparatus 11 by means of a shim element 21 is carried out as follows. First, in method step 100, information 101 is acquired concerning a dependence of an induced field of the shim element 21 on a set shim setting. The information can be transferred for example from the computer-readable data medium 23 to the determination processor 33 or may be stored in a memory of the computer 24. The acquired information 101 is preferably acquired in such a way that the determination processor 33 is able to access it during the further course of the method.

In the following method step 200, a first field map 201 is recorded which specifies the spatial distribution of the basic magnetic field 18 preferably in the region circumscribed by the local transmit coil 12 or in a part of the patient receiving zone 14. In method step 300, the first shim setting 301 for the shim element 21 is determined based on the first field map 201. The position of the shim element 21 relative to the magnetic resonance apparatus 11 is preferably taken into account in the process. The goal of the determination is typically to increase the homogeneity of the basic magnetic field 18 when the shim element 21 is driven in accordance with the first shim setting 301. In the following method step 400, a second field map 401 is recorded, the shim element 21 being driven in accordance with the first shim setting 301 while the recording is taking place. In the following method step 500, a field 501 induced by the shim element 21 by the first shim setting 301 is determined based on the first field map 201 and the second field map 401.

In method step 600, a second shim setting 601 is determined based on the determined induced field 501 and the acquired information 101. The determination of the second shim setting 601 preferably is performed by a calculation of an induced field for the first shim setting 301 of the shim element 21 based on the acquired information 101, and a comparison of the calculated induced field with the determined induced field 501. The comparison is preferably carried out by means of regression analysis, taking into account at least one variable for a spatial displacement and/or for a scalar amplitude modulation. In method step 600, the position of the shim element 21 relative to the magnetic resonance scanner 13 and/or relative to the patient 15 is preferably taken into account. Optionally, in the further method step 700, image data of the examination subject, in particular of the patient 15, may be acquired, the shim element 21 being driven in accordance with the second shim setting 601 during the acquisition of the image data.

FIG. 3 shows a flowchart of a second embodiment variant of the method according to the invention. The flowchart of the second embodiment is based on the flowchart of the first embodiment and supplements the same with further method steps. Compared to the first embodiment, it is based on a further shim element 22. The further shim element 22 is preferably integrated into the magnetic resonance apparatus 11 and/or arranged so as to be immovable.

In method step 310, analogously to the determination of the first shim setting 301 for the shim element 21 in method step 300, a third shim setting 311 for the further shim element 22 can be determined based on the first field map 201. Method steps 300 and 310 can be performed simultaneously. According to the second embodiment variant of the method, the second field map 401 is recorded in method step 400 while, in addition to the shim element 21 being driven in accordance with the first shim setting 301, the further shim element 22 is driven in accordance with the third shim setting 311.

In method step 610, analogously to the determination of the second shim setting 601 for the shim element 21 in method step 600, a fourth shim setting 611 for the further shim element 22 can be determined based on the determined induced field 501 and the acquired information 101. Method steps 600 and 610 can be performed simultaneously. A position of the shim element 21 relative to the further shim element 22 is preferably taken into account during determination of the first 301 and/or second 601 and/or third 311 and/or fourth shim setting 611.

If the optional method step 700 for acquiring image data is carried out, the shim element 21 is preferably driven in accordance with the second shim setting 601, and the further shim element 22 in accordance with the fourth shim setting 611, during the acquisition of the image data.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for determining a shim setting for a shim element situated in a magnetic resonance (MR) data acquisition scanner, in order to increase a homogeneity of a basic magnetic field generated in the scanner, said method comprising:
   providing information in a processor that describes a dependence of an induced field produced by the shim element on a set shim setting;
   operating the scanner, with said shim element driven by said set shim setting, to record a first field map of said basic magnetic field;
   providing said first field map to said processor and, in said processor using said first map to determine a first shim setting for said shim element;
   operating the scanner, with said shim element driven by said first shim setting, to record a second field map of said basic magnetic field;
   providing said second field map to said processor and, in said processor, using said first field map and said second field map to determine a field induced by said shim element in said scanner by said first shim setting;
   in said processor, using the determined induced field and said information to determine a second shim setting for said shim element; and
   emitting an electronic signal from said processor, corresponding to said second shim setting, in a form configured to drive said shim element with said second shim setting.

2. A method as claimed in claim 1 comprising operating said scanner with said shim element driven by said second shim setting to acquire MR data from a subject situated in the MR scanner.

3. A method as claimed in claim 1 comprising determining said second shim setting, in said processor by:
   calculating an induced field produced by said shim element driven by said first shim setting, based on said information; and
   comparing the calculated induced field with the determined induced field to obtain a comparison result, and determining said second shim setting dependent on said comparison result.

4. A method as claimed in claim 3 comprising comparing said calculated induced field with said determined induced field by executing a regression analysis algorithm, dependent on at least one of a variable representing a spatial displacement of said shim element, and a scaler amplitude modulation.

5. A method as claimed in claim 1 comprising using, as said shim element, a local shim element that is positionable at respectively different positions within said scanner.

6. A method as claimed in claim 5 comprising integrating said local shim element into a local transmit coil that is used to radiate or detect radio-frequency signals in said scanner.

7. A method as claimed in claim 1 wherein said scanner has a further shim element therein, and comprising:
   in said processor, using said first map to determine a shim setting for said further shim element; and
   from said processor, emitting a further electronic signal, representing said shim setting for said further shim element, in a form for driving said further shim element with that shim setting.

8. A method as claimed in claim 7 wherein said shim element has a position in said scanner relative to said further shim element, and determining at least one of said first shim setting for said shim element, or said second shim setting for said shim element, or said shim setting for said further shim element, dependent on said position.

9. A method as claimed in claim 1 wherein said scanner has a further shim element therein, and comprising:
   in said processor, using the determined induced field and said information to determine a shim setting for said further shim element dependent on the determined induced field and said acquired information; and
   from said processor, emitting a further electronic signal, representing said shim setting for said further shim element, in a form for driving said further shim element with that shim setting.

10. A method as claimed in claim 9 wherein said shim element has a position in said scanner relative to said further shim element, and determining at least one of said first shim setting for said shim element, or said second shim setting for said shim element, or said shim setting for said further shim element, dependent on said position.

11. A magnetic resonance (MR) apparatus comprising:
    an MR data acquisition scanner having a basic field magnet that generates a basic magnetic field in said scanner, said basic magnetic field having a homogeneity;
    a shim element in said scanner that is operable to produce an induced field that influences said homogeneity of said basic magnetic field;
    a processor provided with information that describes a dependence of an induced field produced by the shim element on a set shim setting;
    said processor being configured to operate the scanner, with said shim element driven by said set shim setting, to record a first field map of said basic magnetic field;
    said first field map being provided to said processor, and said processor being configured to use said first field map to determine a first shim setting for said shim element;
    said processor being configured to operate the scanner, with said shim element driven by said first shim setting, to record a second field map of said basic magnetic field;
    said second field map being provided to said processor, and said processor being configured to use said first field map and said second field map to determine a field induced by said shim element in said scanner by said first shim setting;
    said processor being configured to use the determined induced field and said information to determine a second shim setting for said shim element; and
    said processor being configured to emit an electronic signal from said processor, corresponding to said second shim setting, in a form configured to drive said shim element with said second shim setting.

12. A non-transitory, computer-readable data storage medium encoded with programming instructions, said storage medium being loaded into a processor of a magnetic resonance (MR) apparatus that comprises an MR data acquisition scanner in which a basic magnetic field, having a field homogeneity, is generated, and a shim element that is operable to produce an induced field that influences said homogeneity, said storage medium being encoded with programming instructions and said programming instructions causing said processor to:
    receive an electronic designation that describes a dependence of an induced field produced by the shim element on a set shim setting;
    operate the scanner, with said shim element driven by said set shim setting, to record a first field map of said basic magnetic field;
    use said first field map to determine a first shim setting for said shim element;
    operate the scanner, with said shim element driven by said first shim setting, to record a second field map of said basic magnetic field;
    use the determined induced field and said information to determine a field induced by said shim element in said scanner by said first shim setting;
    use the determined induced field and said information to determine a second shim setting for said shim element; and
    emit an electronic signal from said processor, corresponding to said second shim setting, in a form configured to drive said shim element with said second shim setting.

* * * * *